(12) United States Patent
Chen

(10) Patent No.: US 11,009,996 B2
(45) Date of Patent: May 18, 2021

(54) OPTICAL PROXIMITY SENSOR WITH DIGITAL CALIBRATION CIRCUIT AND DIGITAL CALIBRATION METHOD THEREOF

(71) Applicant: ANPEC ELECTRONICS CORPORATION, Hsinchu (TW)

(72) Inventor: Jing-Min Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/710,011

(22) Filed: Dec. 11, 2019

(65) Prior Publication Data

US 2021/0081072 A1   Mar. 18, 2021

(30) Foreign Application Priority Data

Sep. 18, 2019   (TW) .................................. 108133666

(51) Int. Cl.
| | |
|---|---|
| *G06F 3/041* | (2006.01) |
| *G06F 1/16* | (2006.01) |
| *H03K 17/94* | (2006.01) |
| *G06F 3/03* | (2006.01) |

(52) U.S. Cl.
CPC .......... *G06F 3/0418* (2013.01); *G06F 1/1626* (2013.01); *G06F 3/0304* (2013.01); *H03K 17/941* (2013.01); *H03K 2217/94031* (2013.01)

(58) Field of Classification Search
CPC .... G06F 3/0418; G06F 3/0304; G06F 1/1626; H03K 17/941; H03K 17/9627; H03K 2217/94031; H03K 2217/941; H03K 2217/94104; H03K 2217/94108
See application file for complete search history.

(56) References Cited

U.S. PATENT DOCUMENTS

| | | | | |
|---|---|---|---|---|
| 5,063,622 | A * | 11/1991 | Tsutsui .................... | E03D 5/105 4/623 |
| 8,222,591 | B2 * | 7/2012 | Lin ......................... | G01S 17/10 250/214 DC |
| 8,963,759 | B2 * | 2/2015 | Yan ......................... | H03M 1/56 341/156 |
| 10,298,280 | B2 * | 5/2019 | Nys ....................... | H04B 1/3838 |
| 2011/0181861 | A1 * | 7/2011 | Ritter ....................... | G01J 9/00 356/3 |

(Continued)

*Primary Examiner* — Kenneth Bukowski
(74) *Attorney, Agent, or Firm* — Li & Cai Intellectual Property (USA) Office

(57) ABSTRACT

An optical proximity sensor with a digital calibration circuit and a digital calibration method are provided. In a test mode, a test light emitted by a light transmitter is reflected by a cover of an electronic device to form a first reflected analog signal to a light receiver. A digital calibration circuit counts the first number of pulse waves of a first reflected digital signal. In a calibration mode, a light is emitted to a detected object through the cover and then is reflected by the detected object to form a second reflected analog signal to the light receiver. When the digital calibration circuit counts the number of pulse waves of a second reflected digital signal up to the first number, the digital calibration circuit clears the first number and then recounts the number of pulse waves of the second reflected digital signal to obtain the second number.

12 Claims, 8 Drawing Sheets

(56) References Cited

U.S. PATENT DOCUMENTS

| | | | | |
|---|---|---|---|---|
| 2013/0004157 A1* | 1/2013 | Hakim | ................... | H04B 10/40 |
| | | | | 398/25 |
| 2013/0120761 A1* | 5/2013 | Dyer | .................... | G01S 7/4912 |
| | | | | 356/614 |
| 2013/0169947 A1* | 7/2013 | Hakim | ................ | G01C 15/002 |
| | | | | 356/3.1 |
| 2014/0131551 A1* | 5/2014 | Lin | ........................ | G01S 7/497 |
| | | | | 250/206.1 |
| 2014/0213323 A1* | 7/2014 | Holenarsipur | ........ | G06F 3/0304 |
| | | | | 455/566 |
| 2015/0097789 A1* | 4/2015 | Hsu | ....................... | G01N 21/94 |
| | | | | 345/173 |
| 2015/0145764 A1* | 5/2015 | Hiromi | ................... | G01S 17/36 |
| | | | | 345/156 |
| 2016/0116592 A1* | 4/2016 | Hiromi | ................ | G01S 7/4918 |
| | | | | 345/156 |
| 2017/0034888 A1* | 2/2017 | Verma | .................... | H05B 45/00 |
| 2018/0335853 A1* | 11/2018 | Chiu | ...................... | G01B 11/14 |

\* cited by examiner

OPTICAL PROXIMITY SENSOR WITH DIGITAL CALIBRATION CIRCUIT AND DIGITAL CALIBRATION METHOD THEREOF

CROSS-REFERENCE TO RELATED PATENT APPLICATION

This application claims the benefit of priority to Taiwan Patent Application No. 108133666, filed on Sep. 18, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical proximity sensor, and more particularly to an optical proximity sensor with a digital calibration circuit and a digital calibration method thereof.

BACKGROUND OF THE DISCLOSURE

A cell phone having a touch screen is becoming more and more popular. When a user makes a call, a face of the user may easily touch the touch screen of the cell phone to inadvertently trigger the cell phone to perform an operation. Therefore, an optical proximity sensor is often installed in the cell phone. When the optical proximity sensor detects that light is blocked, a system of the cell phone determines that the face is too close to the touch screen, and thus the touch screen is turned off, thereby preventing the cell phone from being triggered unexpectedly by being touched with the face, and a power of the cell phone can be saved during the call.

SUMMARY OF THE DISCLOSURE

In response to the above-referenced technical inadequacies, the present disclosure provides an optical proximity sensor with a digital calibration circuit. The digital calibration circuit is disposed in an electronic device including a cover disposed between the optical proximity sensor and a detected object. The optical proximity sensor includes a light sensor circuit, an analog-digital converter circuit and the digital calibration circuit. The light sensor circuit includes a light transmitter and a light receiver. A test light emitted by the light transmitter is reflected by the cover to form a first reflected analog signal to the light receiver in a test mode. In a calibration mode, a light emitted by the light transmitter is reflected to the detected object by the cover and then is reflected by the detected object to form a second reflected analog signal to the light receiver. The analog-digital converter circuit is connected to the light receiver. The analog-digital converter circuit is configured to convert the first reflected analog signal into a first reflected digital signal in the test mode and convert the second reflected analog signal into a second reflected digital signal in the calibration mode. The digital calibration circuit is connected to the analog-digital converter circuit and configured to, in the test mode, count a first number of pulse waves of the first reflected digital signal. In the calibration mode, when the digital calibration circuit counts the number of pulse waves of the second reflected digital signal up to the first number, the digital calibration circuit clears the first number and then recounts the number of pulse waves of the second reflected digital signal to obtain a second number.

In certain embodiments, the analog-digital converter circuit includes a comparator having a first input terminal connected to a capacitor and a second input terminal connected to a reference voltage source. A current of the first reflected analog signal charges the capacitor to have a first capacitor voltage. The comparator compares the first capacitor voltage with a reference voltage of the reference voltage source to output the first reflected digital signal. A current of the second reflected analog signal charges the capacitor to have a second capacitor voltage. The comparator compares the second capacitor voltage with the reference voltage to output the second reflected digital signal.

In certain embodiments, the digital calibration circuit further includes a switch component, a first terminal of the switch component is connected to the first input terminal, a second terminal of the switch component is grounded, and a control terminal of the switch component is connected to an output terminal of the comparator.

In certain embodiments, the analog-digital converter circuit converts a leakage current analog signal of the optical proximity sensor into a leakage current digital signal, and the digital calibration circuit counts a third number of pulse waves of the leakage current digital signal, in a leakage current detection mode. In the calibration mode, when the digital calibration circuit counts the number of pulse waves of the second reflected digital signal up to the first number and the third number, the digital calibration circuit clears the first number and the third number and then recounts the number of pulse waves of the second reflected digital signal to obtain the second number.

In certain embodiments, the analog-digital converter circuit includes a comparator having a first input terminal connected to a capacitor and a second input terminal connected to a reference voltage source. A current of the leakage current analog signal flows to the capacitor to charge the capacitor to have a leakage current capacitor voltage, and the comparator compares the leakage current capacitor voltage with a reference voltage of the reference voltage source to output the leakage current digital signal.

In certain embodiments, the digital calibration circuit further includes a switch component, a first terminal of the switch component is connected to the first input terminal, a second terminal of the switch component is grounded, and a control terminal of the switch component is connected to an output terminal of the comparator.

In addition, the present disclosure provides a digital calibration method of an optical proximity sensor. The optical proximity sensor is disposed in an electronic device including a cover disposed between the optical proximity sensor and a detected object. The digital calibration method includes the following steps: in a test mode, emitting a test light to the cover by a light transmitter of a light sensor circuit, and reflecting the test light to form a first reflected analog signal to a light receiver of the light sensor circuit by the cover; converting the first reflected analog signal into a first reflected digital signal by an analog-digital converter circuit in the test mode; counting a first number of pulse waves of the first reflected digital signal by a digital calibration circuit in the test mode; emitting a light to the cover by the light transmitter, then reflecting the light to the detected object through the cover, and then reflecting the light to form a second reflected analog signal to the light receiver by the detected object, in a calibration mode; converting the second reflected analog signal into a second reflected digital signal by the analog-digital converter circuit in the calibration mode; start counting the number of pulse waves of the second reflected digital signal by the digital calibration circuit in the calibration mode; and clearing, in the calibration mode, the first number and then recounting the number of pulse waves of the second reflected digital signal to obtain a second number, when counting the number of pulse waves of the second reflected digital signal up to the first number, by the digital calibration circuit.

In certain embodiments, the digital calibration method further includes steps: charging a capacitor to have a first capacitor voltage by a current of the first reflected analog signal; comparing the first capacitor voltage with a reference voltage of a reference voltage source to output the first reflected digital signal by a comparator of the analog-digital converter circuit; charging the capacitor to have a second capacitor voltage by a current of the second reflected analog signal; and comparing the second capacitor voltage with the reference voltage to output the second reflected digital signal by the comparator.

In certain embodiments, the digital calibration method further includes steps: turning on a switch component by the first reflected digital signal to reduce a voltage of an input terminal of the comparator to zero from the first capacitor voltage; and turning on the switch component by the second reflected digital signal to reduce a voltage of the input terminal of the comparator to zero from the second capacitor voltage.

In certain embodiments, the digital calibration method further includes steps: converting a leakage current analog signal of the optical proximity sensor into a leakage current digital signal by the analog-digital converter circuit in a leakage current detection mode; counting the third number of the leakage current digital signal by the digital calibration circuit in the leakage current detection mode; and clearing the first number and the third number and then recounts the number of pulse waves of the second reflected digital signal to obtain the second number, when counting the number of pulse waves of the second reflected digital signal up to the first number and the third number, by the digital calibration circuit in the calibration mode.

In certain embodiments, the digital calibration method further includes steps: lowing a current of the leakage current analog signal to the capacitor to charge the capacitor to have a leakage current capacitor voltage; and comparing the leakage current capacitor voltage with a reference voltage of a reference voltage source to output the leakage current digital signal by a comparator of the analog-digital converter circuit.

In certain embodiments, the digital calibration method further includes step: turning on a switch component by the leakage current digital signal to reduce a voltage of an input terminal of the comparator to zero from the leakage current capacitor voltage.

As described above, the present disclosure provides the optical proximity sensor with the digital calibration circuit and the digital calibration method. The optical proximity sensor obtains the leakage current calibration code and the reflection calibration code formed by reflecting the light from the light transmitter by the cover of the electronic device. The leakage current and the deviation value caused by energy reflected by the cover are completely eliminated by the digital calibration mechanism. The present disclosure applies the digital calibration circuit to replace a subtractor. Therefore, the present disclosure not only saves a space occupied by the subtractor, but also applies a manner of clearing to effectively solve a problem that a maximum value cannot be sensed, which is caused by the subtractor directly subtracting the deviation value.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
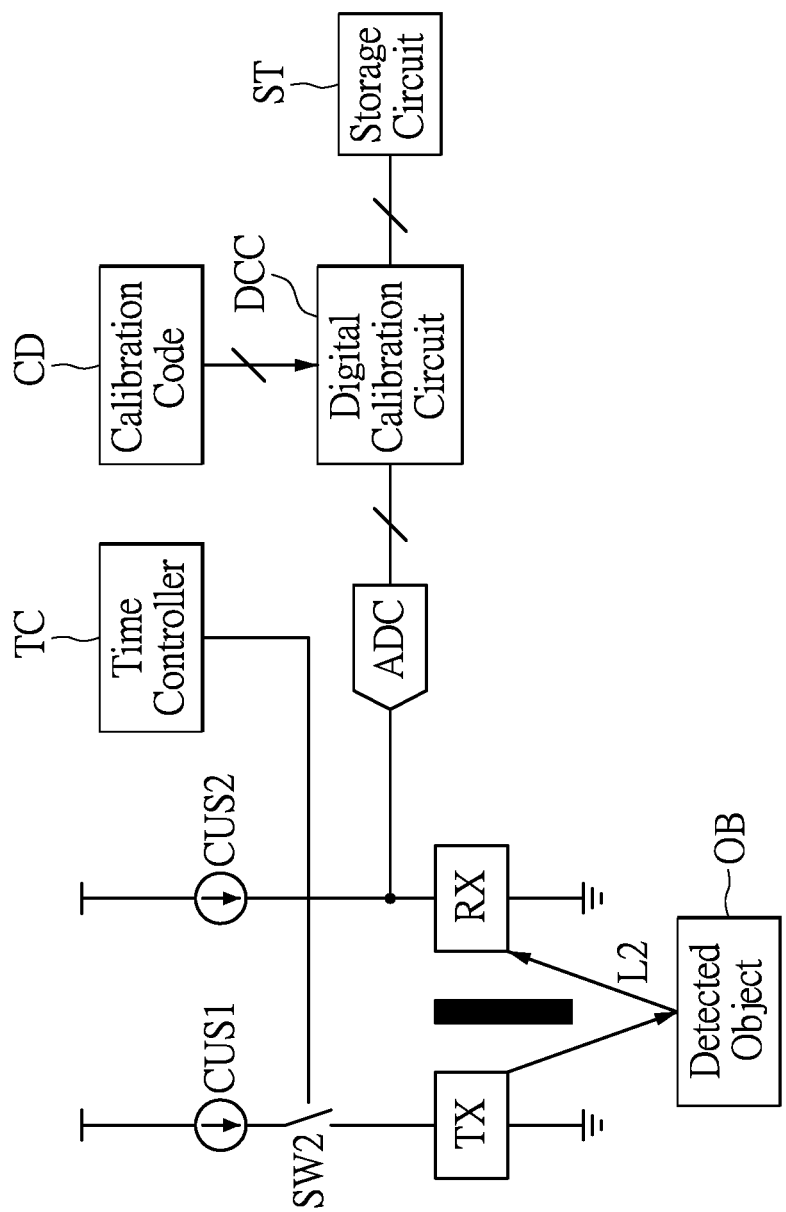
FIG. 1 is a circuit layout diagram of an optical proximity sensor with a digital calibration circuit according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit layout diagram of an optical proximity sensor with a digital calibration circuit according to a first embodiment of the present disclosure.

As shown in FIG. 1, in the embodiment, the optical proximity sensor includes a light sensor circuit, an analog-digital converter circuit ADC and a digital calibration circuit DCC. The light sensor circuit includes a light transmitter TX and a light receiver RX. The analog-digital converter circuit ADC is connected to the light receiver RX and the digital calibration circuit DCC. The optical proximity sensor of the embodiment is installed in an electronic device such as a cell phone. The electronic device includes a cover such as a glass substrate.

In practice, a leakage current exists in the optical proximity sensor operating under a non-ideal condition, regardless of whether or not the light transmitter TX emits light. As used herein, the leakage current is represented by as a leakage current analog signal. In the embodiment, the optical proximity sensor applies a digital calibration mechanism. Therefore, in a leakage current detection mode, the light transmitter TX does not emit any light and the light receiver RX does not receive a current generated by reflecting light by a detected object OB. Under this condition, the analog-digital converter circuit ADC only receives the leakage current analog signal and converts the received leakage current analog signal into a leakage current digital signal.

A counter of the digital calibration circuit DCC counts the number of pulse waves of the leakage current digital signal from the analog-digital converter circuit ADC. As used herein, the number of pulse waves of the leakage current digital signal is represented by a third number of pulse waves and taken as a leakage current calibration code included in a calibration code CD.

Therefore, in a test mode, a test in which a test light is reflected by the cover of the electronic device is performed. A time controller TC is connected to a control terminal of a second switch SW2 and configured to turn on the second switch SW2 within a preset time to allow a first current provided by a first current source CUS1 to flow to the light transmitter TX through the second switch SW2 for an operation of the light transmitter TX. The light transmitter TX emits the test light toward the detected object OB. Then, the test light is reflected to form a first reflected analog signal to the light receiver RX by the cover of the electronic device.

A second current source CUS2 may provide a second current to the light receiver RX for an operation of the light receiver RX. The light receiver RX receives the first reflected analog signal formed by reflecting the test light by the cover of the electronic device and transmits the first reflected analog signal to the analog-digital converter circuit ADC. The analog-digital converter circuit ADC converts the first reflected analog signal into a first reflected digital signal and outputs it to the digital calibration circuit DCC. The digital calibration circuit DCC counts the number of pulse waves of the first reflected digital signal.

It is worth noting that the leakage current exists in the optical proximity sensor. Therefore, the number of pulse waves of the first reflected digital signal includes the third number of pulse waves of the leakage current digital signal, and a first number of pulse waves of the first reflected digital signal formed by reflecting the test light by the cover. The digital calibration circuit DCC subtracts the third number from the number of the pulse waves of the first reflected digital signal to obtain the first number as a reflection calibration code, which is included in the calibration code CD.

After the calibration code CD is obtained in the test mode, the optical proximity sensor of the embodiment enters a calibration mode.

The detected object OB is positioned close to the electronic device in the calibration mode. The optical proximity sensor is applicable for sensing a distance between the electronic device and the detected object OB. The cover of the electronic device is disposed between the optical proximity sensor and the detected object OB. Therefore, when the light transmitter TX emits a light toward the detected object OB, the light passes through the cover of the electronic device and then is reflected to the detected object OB by the cover, and the light is finally reflected by the detected object OB to form a second reflected analog signal L2 to the light receiver RX.

The light receiver RX transmits the received second reflected analog signal L2 to the analog-digital converter circuit ADC in the calibration mode. The analog-digital converter circuit ADC coverts the second reflected analog signal L2 into a second reflected digital signal. The digital calibration circuit DCC counts the number of pulse waves of the second reflected digital signal from the analog-digital converter circuit ADC.

It is worth noting that, before the light is incident on the detected object OB, the light is reflected by the cover of the electronic device such as a mirror surface of the glass substrate. Therefore, the second reflected analog signal L2 includes the leakage current analog signal, the first reflected analog signal formed by reflecting the light only by the cover, and an object reflecting analog signal formed by reflecting the light only by the detected object OB. As a result, the number of the second reflected analog signal L2 includes the third number of pulse waves of the leakage current analog signal, the first number of pulse waves of the first reflected analog signal, and a second number of pulse waves of the object reflecting analog signal.

In practice, the optical proximity sensor determines the distance between the electronic device and the detected object OB according to an intensity of the light, which is emitted from the light transmitter and then is reflected to the light receiver by the detected object OB. A deviation value is between the number of the pulse waves of the second reflected digital signal and the second number. Therefore, if the distance between the electronic device and the detected object OB is intended to be accurately determined, the number of the pulse waves of the second reflected digital signal needs to be calibrated.

In order to solve the above problem, a conventional calibration circuit applies an analog compensation technology to perform calibration. However, a conversion error may occur in a process of converting a digital signal into an analog signal such that the deviation value cannot be completely compensated. Therefore, the optical proximity sensor in the embodiment is provided to improve on the above-mentioned problem present in a conventional optical proximity sensor, as described specifically in the following.

The digital calibration circuit DCC obtains the third number as the leakage current calibration code and the first number as the reflection calibration code in the calibration mode. When the digital calibration circuit DCC counts the number of pulse waves of the second reflected digital signal up to the third number, the digital calibration circuit DCC clears the third number counted according to the leakage current calibration code to complete a first calibration.

After the third number is cleared, the digital calibration circuit DCC recounts the number of pulse waves of the second reflected digital signal. When the digital calibration circuit DCC recounts the number of pulse waves of the second reflected digital signal up to the first number, the digital calibration circuit DCC clears the first number counted according to the reflection calibration code to complete a second calibration.

Finally, after the first number is cleared, the digital calibration circuit DCC recounts the number of pulse waves of the second reflected digital signal. At this time, the number of pulse waves of the second reflected digital signal counted is equal to the second number of pulse waves of the object reflecting analog signal.

Figure 2:
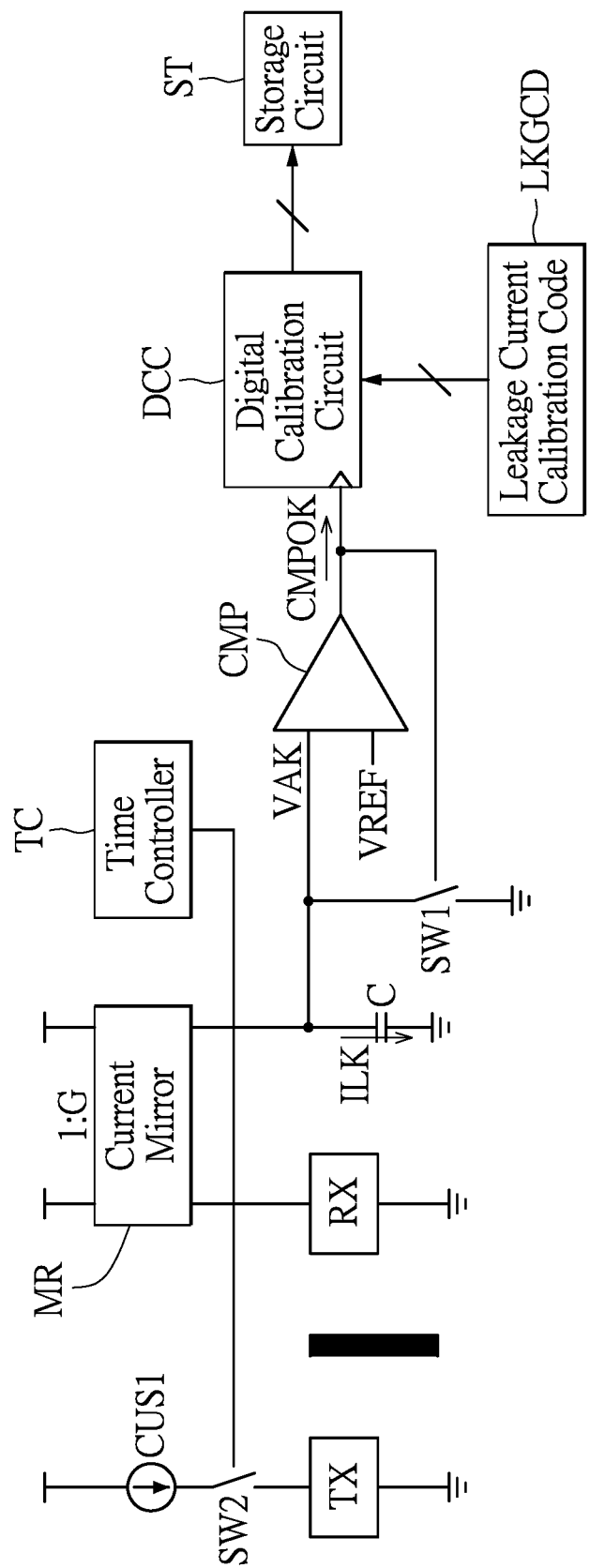
FIG. 2 is a circuit layout diagram of an optical proximity sensor with a digital calibration circuit in a leakage current detection mode according to a second embodiment of the present disclosure.
Figure 3:
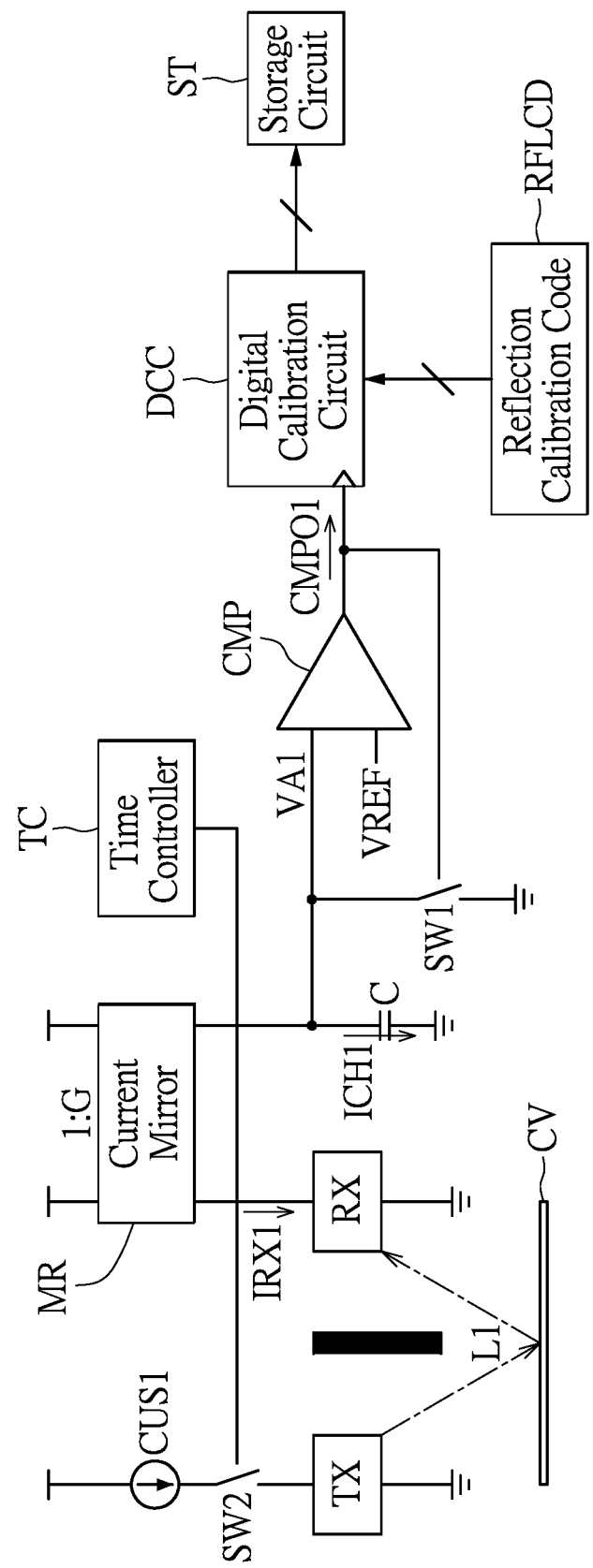
FIG. 3 is a circuit layout diagram of the optical proximity sensor with the digital calibration circuit in a test mode according to the second embodiment of the present disclosure.
Figure 4:
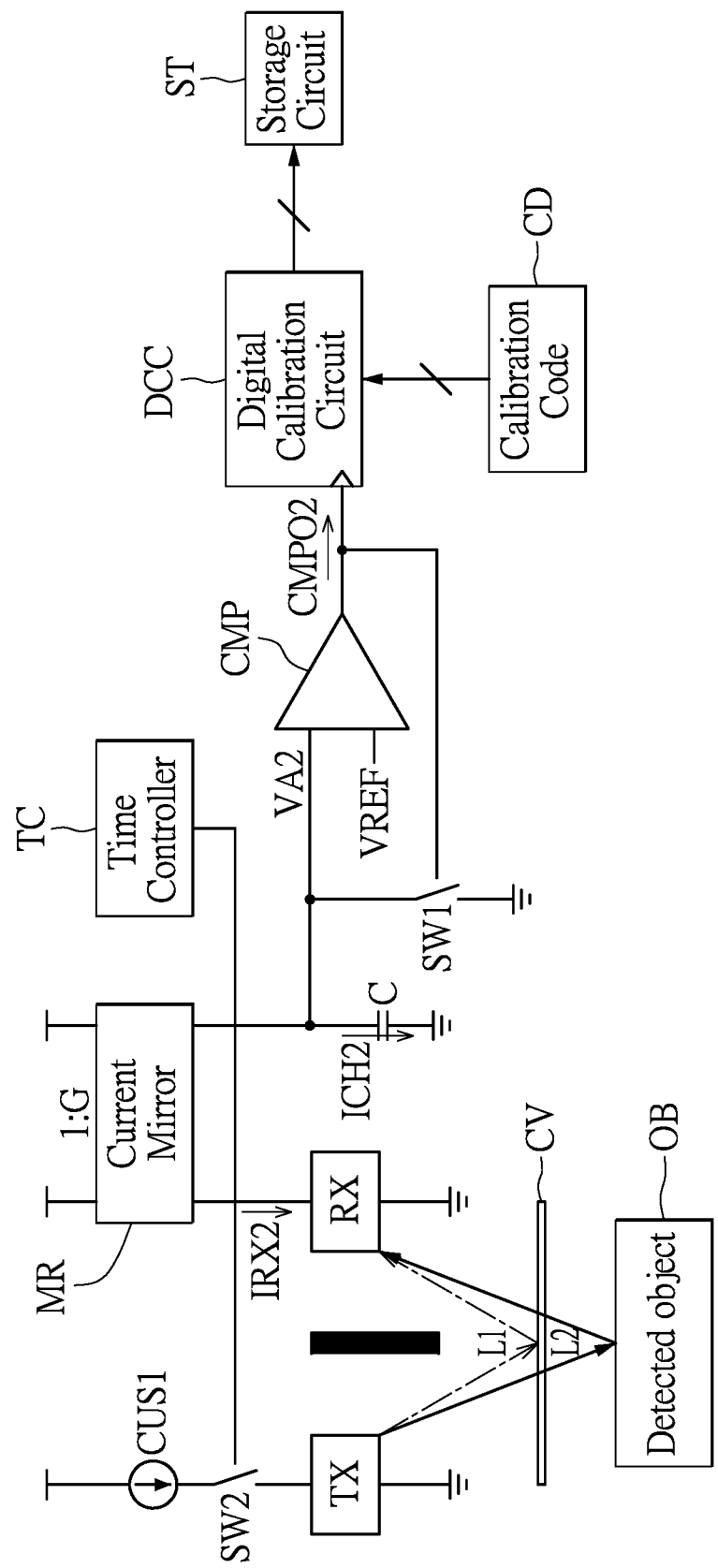
FIG. 4 is a circuit layout diagram of the optical proximity sensor with the digital calibration circuit in a calibration mode according to the second embodiment of the present disclosure.
Figure 8:
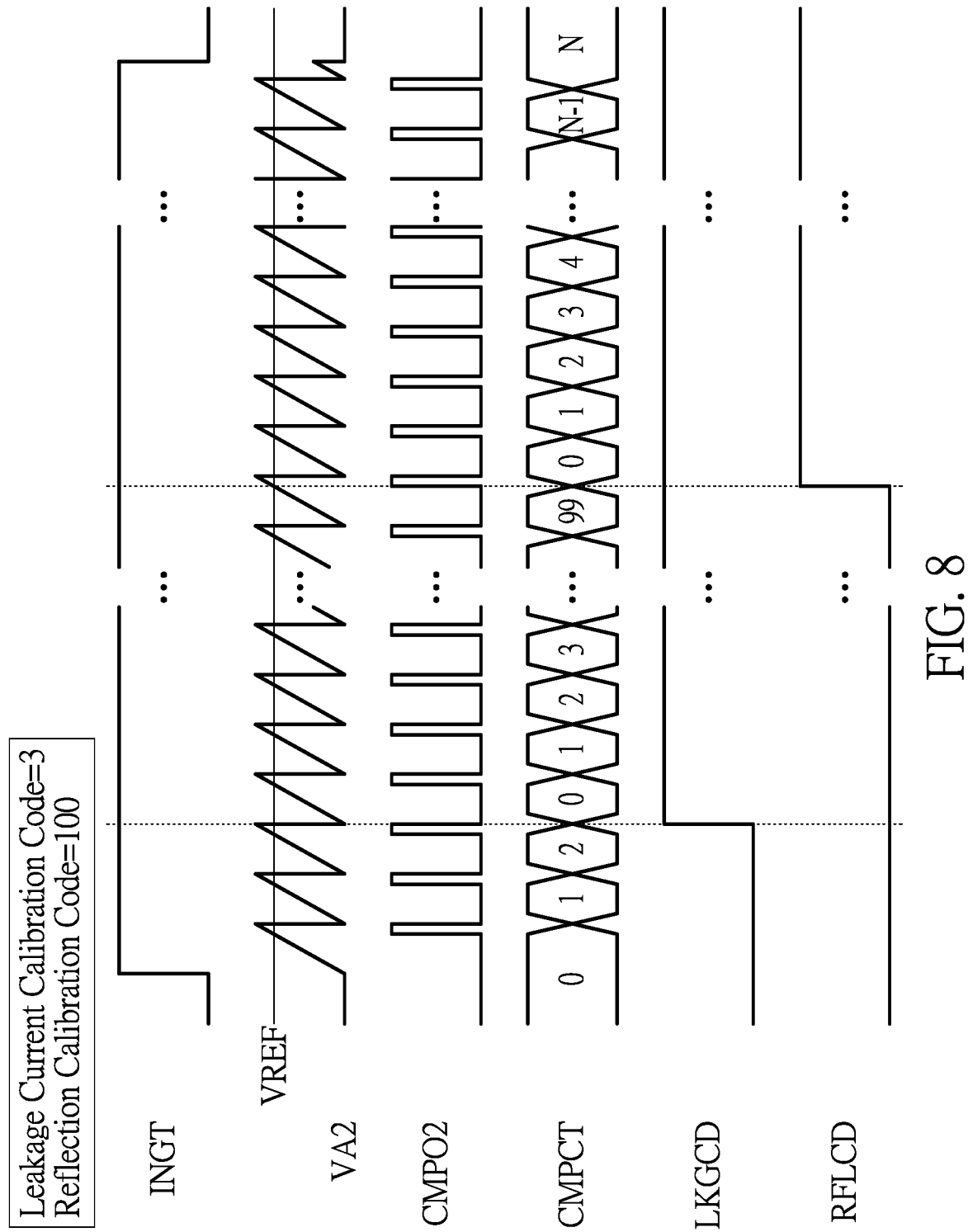
FIG. 8 is a waveform diagram of signals of the optical proximity sensor with the digital calibration circuit according to the second embodiment of the present disclosure.

Reference is made to FIGS. 2 to 4 and 8, wherein FIGS. 2 to 4 are circuit layout diagrams of an optical proximity sensor with a digital calibration circuit respectively in a leakage current detection mode, in a test mode and in a calibration mode according to a second embodiment of the present disclosure, and FIG. 8 is a waveform diagram of signals of the optical proximity sensor with the digital calibration circuit according to the second embodiment of the present disclosure.

As shown in FIGS. 2 to 4, in the embodiment, the optical proximity sensor includes the light transmitter TX, the light receiver RX, an analog-digital converter circuit and the digital calibration circuit DCC.

A difference between the first and second embodiments is that, the optical proximity sensor in the second embodiment includes a comparator CMP. A first input terminal such as a non-interval terminal of the comparator CMP is connected to the capacitor C. The capacitor C is connected to a current mirror MR. The current mirror MR is connected to the light receiver RX. A second input terminal such as an interval terminal of the comparator CMP is connected to a reference voltage source. An output terminal of the comparator CMP is connected to the digital calibration circuit DCC.

First, as shown in FIG. 2, in the leakage current detection mode, the light transmitter TX does not emit any light. Under this condition, only a current ILK of the leakage current analog signal of the optical proximity sensor flows to the capacitor C. The first input terminal of the comparator CMP obtains a leakage current capacitor voltage VAK of the capacitor C. The second input terminal of the comparator CMP receives a reference voltage VREF from the reference voltage source.

The comparator CMP compares the leakage current capacitor voltage VAK with the reference voltage VREF to output a leakage current digital signal CMPOK. For example, when the comparator CMP determines that the leakage current capacitor voltage VAK of the capacitor C is higher than the reference voltage VREF, the comparator CMP outputs the leakage current digital signal CMPOK at a high level. That is, the leakage current digital signal CMPOK has a pulse wave.

The digital calibration circuit DCC may include a switch component SW1. A first terminal of the switch component SW1 is connected to the first input terminal of the comparator CMP. A second terminal of the switch component SW1 is grounded. A control terminal of the switch component SW1 is connected to the output terminal of the comparator CMP.

During or after the comparator CMP outputs the leakage current digital signal CMPOK at the high level to the digital calibration circuit DCC, the switch component SW1 is turned on by the leakage current digital signal CMPOK at the high level such that the first input terminal of the comparator CMP is grounded. As a result, a voltage of the first input terminal of the comparator CMP reduces to zero from the leakage current capacitor voltage VAK. When the comparator CMP determines that the leakage current capacitor voltage VAK of the capacitor C is higher than the reference voltage VREF again, a next pulse is generated.

The digital calibration circuit DCC counts the third number of pulse waves of the leakage current digital signal CMPOK as a leakage current calibration code LKGCD. In the embodiment, the optical proximity sensor may further include a storage circuit ST, which is configured to store the leakage current calibration code LKGCD.

After the leakage current calibration code LKGCD is obtained as shown in FIG. 2, the optical proximity sensor in the embodiment enters the test mode.

As shown in FIG. 3, in the test mode, the light transmitter TX emits the light toward the cover CV of the electronic device. Then, the light is reflected by the cover CV to form a first reflected analog signal L1 to the light receiver RX. At this time, a current IRX1 received by the light receiver RX is equal to a current of the first reflected analog signal L1. The current IRX1 is multiplied by a factor of G by the current mirror MR and the multiplied current IRX1 flows to the capacitor C, wherein G is an arbitrary value that can be set.

It should be understood that, a charging current ICH1 of the capacitor C shown in FIG. 3 is equal to a sum of the multiplied current IRX1 and the current ILK of the leakage current analog signal. The charging current ICH1 flows to the capacitor C to charge the capacitor C to have a first capacitor voltage VA1. The comparator CMP compares the first capacitor voltage VA1 with the reference voltage VREF to output a first reflected digital signal CMPO1.

The digital calibration circuit DCC subtracts the third number of the leakage current digital signal CMPOK from the number of the pulse waves of the first reflected digital signal COMO1 counted to obtain the first number as a reflection calibration code RFLCD according to the leakage current calibration code LKGCD. The digital calibration circuit DCC may store the reflection calibration code RFLCD. Alternatively, the digital calibration circuit DCC may output the reflection calibration code RFLCD to the storage circuit ST to be stored by the storage circuit ST.

After the leakage current calibration code LKGCD and the reflection calibration code RFLCD are obtained as shown in FIGS. 2 and 3, the optical proximity sensor in the embodiment enters the calibration mode.

As shown in FIG. 4, in the calibration mode, the light transmitter TX emits the light to the cover CV of an electronic device EL. Then, the light passes through the cover CV and is reflected by the cover CV to the detected object OB. Then, the light is reflected by the detected object OB to form the second reflected analog signal L2 to the light receiver RX. A charging current ICH2 of the capacitor C is composed of a current IRX2 of the second reflected analog signal L2 of G times and the current ILK of the leakage current analog signal, which is represented by the following first equation:

$$ICH2 = IRX2 \times G + ILK,$$

wherein ICH2 represents the charging current of the capacitor C shown in FIG. 4, IRX2 represents the current of the second reflected analog signal L2, G represents a factor by which the current IRX2 is multiplied by the current mirror MR, and ILK represents the current of the leakage current analog signal.

The comparator CMP compares a second capacitor voltage VA2 with the reference voltage VREF to output a second reflected digital signal CMPO2. A time required for transiting the second reflected digital signal CMPO2 from 0 to 1 is represented by the following second equation:

$$t = \frac{C \times VREF}{ICH2},$$

wherein t represents the time required for transiting the second reflected digital signal CMPO2 from 0 to 1, C represents a capacitance of the capacitor C shown in FIG. 4, VREF represents the reference voltage, and ICH2 represents the charging current of the capacitor C shown in FIG. 4.

For convenience of explanation, it is assumed that G=1, the first equation is substituted into the second equation to form the following third equation:

$$t = \frac{C \times VREF}{IRX2 + ILK} = \frac{C \times VREF}{IRX1 + IL2 + ILK},$$

wherein t represents the time required for transiting the second reflected digital signal CMPO2 from 0 to 1, C represents the capacitance of the capacitor C, VREF represents the reference voltage, IRX2 represents the current of the second reflected analog signal L2, IRX1 represents the current of the first reflected analog signal L1 formed by reflecting the light from the light transmitter TX only by the cover CV, IL2 represents the current of the object reflecting analog signal formed by reflecting the light from the light transmitter TX only by the detected object OB, and ILK represents the current of leakage current analog signal.

The number of the pulse waves counted by the digital calibration circuit DCC is associated with the time t required for transiting the second reflected digital signal CMPO2 from 0 to 1 in the above third equation. The time t is inversely proportional to the charging current ICH2 in the first and third equations. The number of pulse waves counted by the digital calibration circuit DCC is a sum of the second number of pulse waves of a current IL2 of the object reflecting analog signal, the first number of pulse waves of the current IRX1 of the first reflected analog signal L1, and the third number of pulse waves of the current ILK of the leakage current analog signal.

In order to accurately detect the distance between the detected object OB and the electronic device, the digital calibration circuit DCC only needs to count the second number, and does not need to count the first number and the third number. Therefore, the digital calibration circuit DCC must calibrate the number of pulse waves of the second reflected digital signal CMPO2 counted.

However, a conventional optical proximity sensor uses a subtractor to perform calibration. If the number of pulse waves of the second reflected digital signal is equal to a full scale value, the subtractor directly subtracts the first number and the third number from the number of pulse waves of the second reflected digital signal to obtain the second number, which is smaller than the full scale value. That is, a sensing deviation value is between the obtained second number and the full scale value. To solve this problem, the optical proximity sensor in the embodiment applies the digital calibration circuit instead of the subtractor, as described specifically in the following.

When an integration time signal INGT is at a high level as shown in FIG. 8, the current IL2 shown in FIG. 4 charges the capacitor C. As shown in FIG. 8, when the second capacitor voltage VA2 of the capacitor C is charged to be higher than the reference voltage VREF, a pulse wave is generated in the second reflected digital signal CMPO2 outputted by the comparator CMP.

A counting signal CMPCT shown in FIG. 8 represents the number of pulse waves of the second reflected digital signal CMPO2 counted by the digital calibration circuit DCC. The digital calibration circuit DCC obtains the calibration code CD including the leakage current calibration code LKGCD and the reflection calibration code RFLCD.

When the capacitor C is charged by the charging current ICH2 and the number of pulse waves counted by the digital calibration circuit DCC is equal to the leakage current calibration code LKGCD such as 3, the digital calibration circuit DCC clears the counted leakage current calibration code LKGCD, such as 3, to return the number counted to zero. After the leakage current calibration code LKGCD is cleared, the digital calibration circuit DCC recounts. Then, when the number of pulse waves counted by the digital calibration circuit DCC is equal to the reflection calibration code RFLCD such as 100, the digital calibration circuit DCC returns the number counted to zero again.

After the leakage current calibration code LKGCD and the reflection calibration code RFLCD are sequentially cleared, the digital calibration circuit DCC recounts. At this time, the number of pulse waves of the second reflected digital signal CMPO2 counted is, for example, N+1, which is equal to the number of pulse waves of the object reflecting analog signal formed by reflecting the light only on the detected objected OB. In this way, the number of pulse waves of the second reflected digital signal CMPO2 is calibrated.

Figure 5:
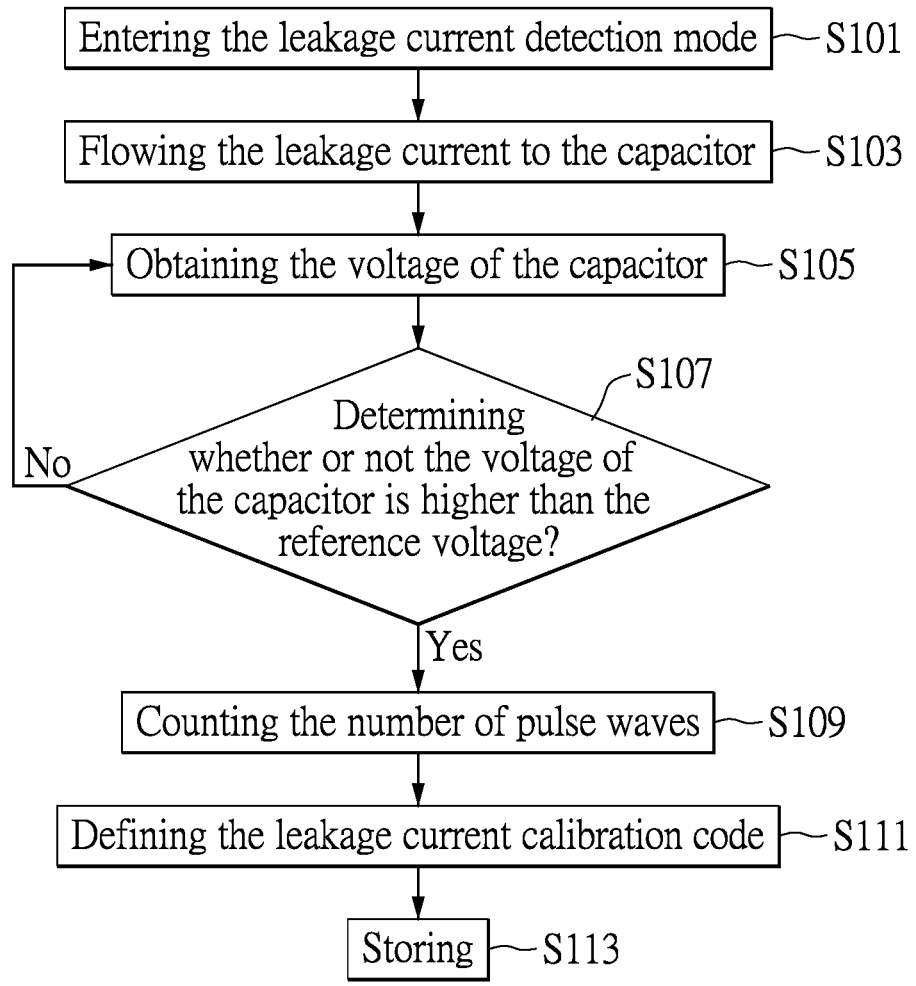
FIG. 5 is a flowchart diagram of obtaining a leakage current calibration code in a digital calibration method of the optical proximity sensor according to the second embodiment of the present disclosure.

Reference is made to FIG. 5, which is a flowchart diagram of obtaining a leakage current calibration code in a digital calibration method of the optical proximity sensor according to the second embodiment of the present disclosure.

In the embodiment, the digital calibration method includes steps S101 to S113 shown in FIG. 5 and uses the optical proximity sensor shown in FIG. 2 to obtain the leakage current calibration code, as described specifically in the following.

In step S101, the optical proximity sensor enters the leakage current detection mode.

In step S103, the leakage current of the optical proximity sensor flows to the capacitor C.

In step S105, the comparator CMP obtains the leakage current capacitor voltage VAK of the capacitor C.

In step S107, the comparator CMP determines whether or not the leakage current capacitor voltage VAK is higher than the reference voltage VREF. If the leakage current capacitor voltage VAK is not higher than the reference voltage VREF, step S105 is performed again. If the leakage current capacitor voltage VAK is higher than the reference voltage VREF, the comparator CMP outputs a pulse wave and then step S109 is performed.

In step S109, the digital calibration circuit DCC counts the number of times that the leakage current capacitor voltage VAK increases to be higher than the reference voltage VREF to count the number of pulse waves outputted by the comparator CMP.

In step S111, the digital calibration circuit DCC defines the number of pulse waves counted in step S109 as the leakage current calibration code LKGCD.

In step S113, the digital calibration circuit DCC stores the leakage current calibration code LKGCD. Alternatively, the digital calibration circuit DCC outputs the leakage current calibration code LKGCD to the storage circuit ST, and the storage circuit ST stores the leakage current calibration code LKGCD.

Figure 6:
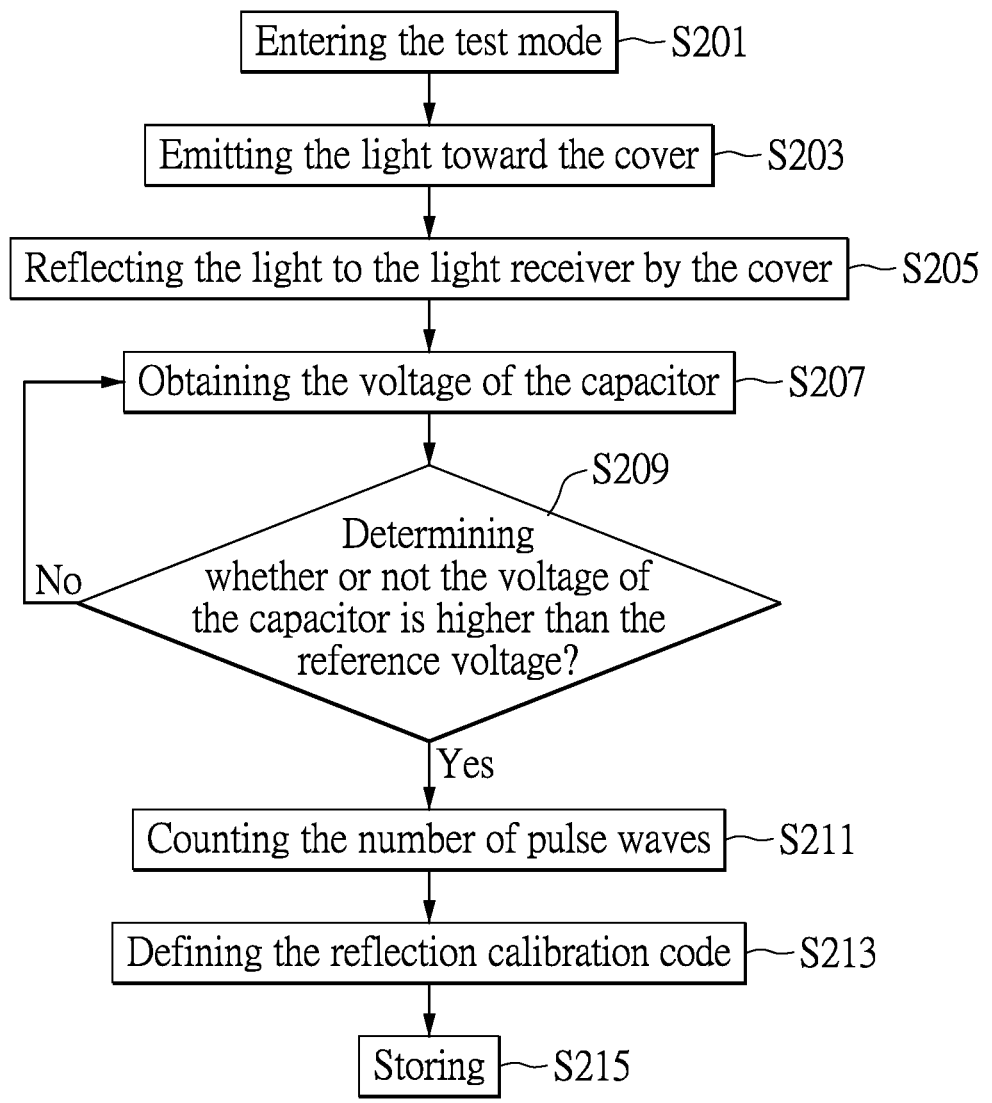
FIG. 6 is a flowchart diagram of obtaining a reflection calibration code in the digital calibration method of the optical proximity sensor according to the second embodiment of the present disclosure.

Reference is made to FIG. 6, which is a flowchart diagram of obtaining a reflection calibration code in the digital calibration method of the optical proximity sensor according to the second embodiment of the present disclosure.

In the embodiment, the digital calibration method includes steps S201 to S215 shown in FIG. 6 and uses the optical proximity sensor shown in FIG. 3 to obtain the reflection calibration code, as described specifically in the following.

In step S201, the optical proximity sensor enters the test mode.

In step S203, the light transmitter TX emits the test light toward the cover CV.

In step S205, the test light emitted by the light transmitter TX is reflected to the light receiver RX by the cover CV of the electronic device EL. The current IRX1 received by the light receiver RX is multiplied by the factor of G by the current mirror MR to generate the charging current ICH1. The charging current ICH1 and the leakage current flow to the capacitor C to charge the capacitor C.

In step S207, the comparator CMP obtains the first capacitor voltage VA1 of the capacitor C.

In step S209, the comparator CMP determines whether or not the first capacitor voltage VA1 is higher than the reference voltage VREF. If the first capacitor voltage VA1 is not higher than the reference voltage VREF, step S207 is performed again. If the first capacitor voltage VA1 is higher than the reference voltage VREF, the comparator CMP outputs a pulse wave and step S211 is next performed.

In step S211, the digital calibration circuit DCC counts the number of times that the first capacitor voltage VA1 increases to be higher than the reference voltage VREF to count the number of pulse waves outputted by the comparator CMP.

In step S213, the digital calibration circuit DCC subtracts the leakage current calibration code LKGCD from the number of pulse waves counted in step S211 to obtain the reflection calibration code RFLCD.

In step S215, the digital calibration circuit DCC stores the reflection calibration code RFLCD. Alternatively, the digital calibration circuit DCC outputs the reflection calibration code RFLCD to the storage circuit ST, and the storage circuit ST stores the reflection calibration code RFLCD.

Figure 7:
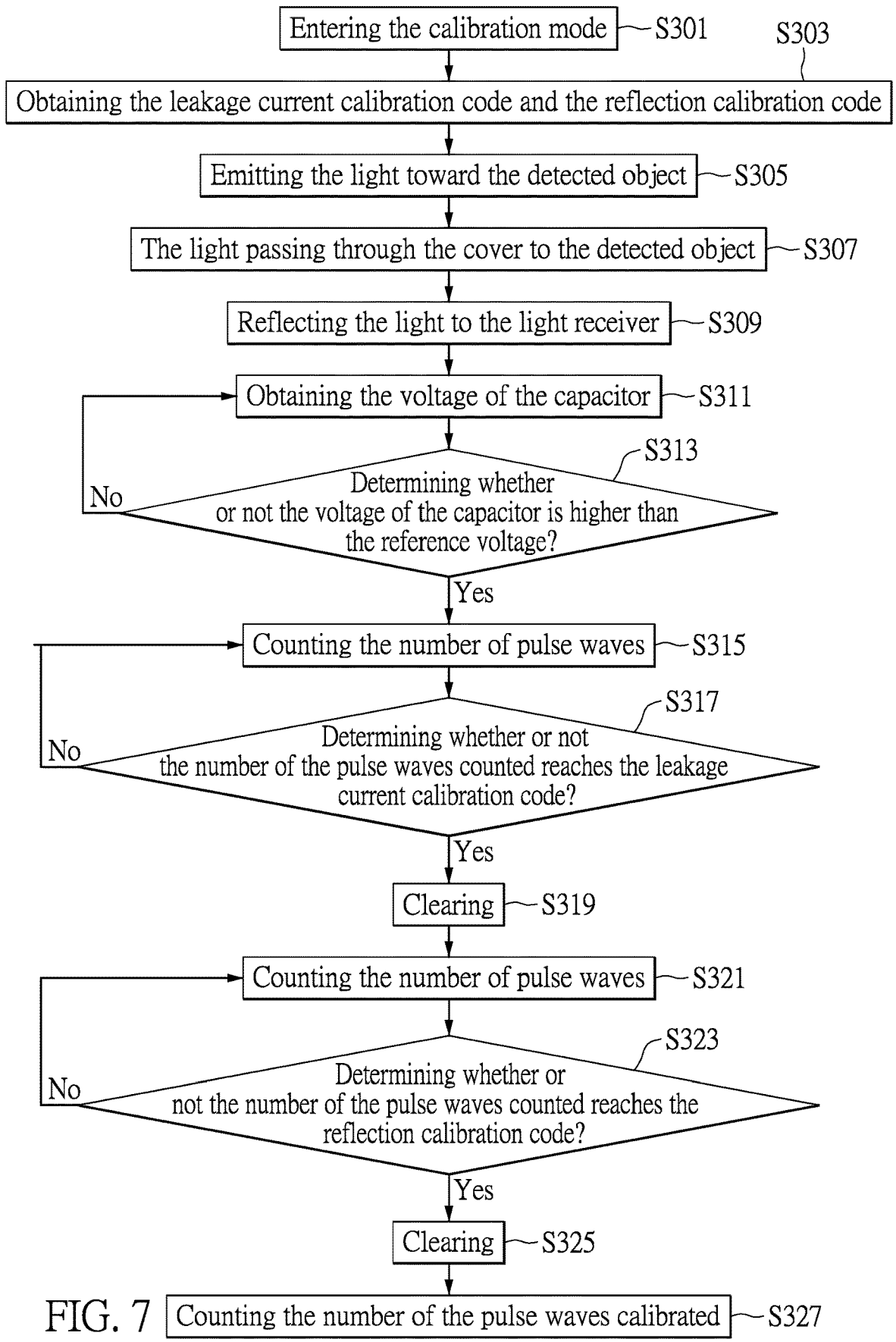
FIG. 7 is a flowchart diagram of obtaining the calibrated number of pulse waves in the digital calibration method of the optical proximity sensor according to the second embodiment of the present disclosure.

Reference is made to FIG. 7, which is a flowchart diagram of obtaining the calibrated number of pulse waves in the digital calibration method of the optical proximity sensor according to the second embodiment of the present disclosure.

The digital calibration method includes steps S301 to S327 shown in FIG. 7, steps S101 to S113 shown in FIG. 5 and steps S201 to S215 shown in FIG. 6, and uses the optical proximity sensor shown in FIG. 3 to obtain the calibrated number of pulse waves, as described specifically in the following.

In step S301, the optical proximity sensor enters the calibration mode.

In step S303, the digital calibration circuit DCC obtains the leakage current calibration code LKGCD in step S113 and the reflection calibration code RFLCD in step S215.

In step S305, the light transmitter TX emits the test light toward the detected object OB.

In step S307, the light of the light transmitter TX passes through the cover CV of the electronic device EL and is reflected to the detected object OB by the cover CV.

In step S309, the light is reflected to the light receiver RX by the detected object OB. The current IRX2 received by the light receiver RX is multiplied by the factor of G by the current mirror MR. The multiplied current IRX2 and the leakage current flow together to form a charging current to the capacitor C to charge the capacitor C.

In step S311, the comparator CMP obtains the second capacitor voltage VA2 of the capacitor C.

In step S313, the comparator CMP determines whether or not the second capacitor voltage VA2 is higher than the reference voltage VREF. If the second capacitor voltage VA2 is not higher than the reference voltage VREF, step S311 is performed again. If the second capacitor voltage VA2 is higher than the reference voltage VREF, the comparator CMP outputs a pulse wave and next step S315 is performed.

In step S315, the digital calibration circuit DCC counts the number of pulse waves.

In step S317, the digital calibration circuit DCC determines whether or not the number of pulse waves counted reaches the leakage current calibration code LKGCD. If the number of pulse waves counted does not reach the leakage current calibration code LKGCD, step S315 is performed continually. If the number of pulse waves counted reaches the leakage current calibration code LKGCD, step S319 is performed.

In step S319, the digital calibration circuit DCC clears the number of pulse waves counted. The number cleared is equal to the leakage current calibration code LKGCD.

In step S321, the digital calibration circuit DCC counts the number of pulse waves.

In step S323, the digital calibration circuit DCC determines whether or not the number of pulse waves counted reaches the reflection calibration code RFLCD. If the number of pulse waves counted does not reach the reflection calibration code RFLCD, step S321 is performed continually. If the number of pulse waves counted reaches the reflection calibration code RFLCD, step S325 is performed.

In step S325, the digital calibration circuit DCC clears the number of pulse waves counted. The number cleared is equal to the reflection calibration code RFLCD.

In step S327, the digital calibration circuit DCC counts the number of pulse waves formed by reflecting the light only by the detected object OB. The number of pulse waves has been calibrated in steps S319 and S325.

In summary, the present disclosure provides the optical proximity sensor with the digital calibration circuit and the digital calibration method. The optical proximity sensor obtains the leakage current calibration code and the reflection calibration code formed by reflecting the light from the light transmitter by the cover of the electronic device. The leakage current and the deviation value caused by energy reflected by the cover are completely eliminated by the digital calibration mechanism. The present disclosure applies the digital calibration circuit replacing the subtractor. Therefore, the present disclosure not only saves a space occupied by the subtractor, but also applies a manner of clearing to effectively solve a problem that a maximum value cannot be sensed, which is caused by the subtractor directly subtracting the deviation value.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical proximity sensor, which is disposed in an electronic device including a cover disposed between the optical proximity sensor and a detected object, the optical proximity sensor comprising:
   a light sensor circuit including a light transmitter and a light receiver, wherein in a calibration mode, a test light emitted by the light transmitter is reflected by the cover to form a first reflected analog signal to the light receiver in a test mode, and a light emitted by the light transmitter is reflected to the detected object by the cover and then is reflected by the detected object to form a second reflected analog signal to the light receiver;
   an analog-digital converter circuit connected to the light receiver, and configured to convert the first reflected analog signal into a first reflected digital signal in the test mode and convert the second reflected analog signal into a second reflected digital signal in the calibration mode; and
   a digital calibration circuit connected to the analog-digital converter circuit and configured to, in the test mode, count a first number of pulse waves of the first reflected digital signal in the test mode, and in the calibration mode, when the digital calibration circuit counts the number of pulse waves of the second reflected digital signal up to the first number, the digital calibration circuit clears the first number and then recounts the number of pulse waves of the second reflected digital signal to obtain a second number.

2. The optical proximity sensor of claim 1, wherein the analog-digital converter circuit includes a comparator having a first input terminal connected to a capacitor and a second input terminal connected to a reference voltage source;
   wherein a current of the first reflected analog signal charges the capacitor to have a first capacitor voltage, and the comparator compares the first capacitor voltage with a reference voltage of the reference voltage source to output the first reflected digital signal; and
   wherein a current of the second reflected analog signal charges the capacitor to have a second capacitor voltage, and the comparator compares the second capacitor voltage with the reference voltage to output the second reflected digital signal.

3. The optical proximity sensor of claim 2, wherein the digital calibration circuit further includes a switch component, a first terminal of the switch component is connected to the first input terminal, a second terminal of the switch component is grounded, and a control terminal of the switch component is connected to an output terminal of the comparator.

4. The optical proximity sensor of claim 1, wherein the analog-digital converter circuit converts a leakage current analog signal of the optical proximity sensor into a leakage current digital signal, and the digital calibration circuit counts a third number of pulse waves of the leakage current digital signal, in a leakage current detection mode; and
   wherein in the calibration mode, when the digital calibration circuit counts the number of pulse waves of the second reflected digital signal up to the first number and the third number, the digital calibration circuit clears the first number and the third number and then recounts the number of pulse waves of the second reflected digital signal to obtain the second number.

5. The optical proximity sensor of claim 4, wherein the analog-digital converter circuit includes a comparator having a first input terminal connected to a capacitor and a second input terminal connected to a reference voltage source;
   wherein a current of the leakage current analog signal flows to the capacitor to charge the capacitor to have a leakage current capacitor voltage, and the comparator compares the leakage current capacitor voltage with a reference voltage of the reference voltage source to output the leakage current digital signal.

6. The optical proximity sensor of claim 5, wherein the digital calibration circuit further includes a switch component, a first terminal of the switch component is connected to the first input terminal, a second terminal of the switch component is grounded, and a control terminal of the switch component is connected to an output terminal of the comparator.

7. A digital calibration method of an optical proximity sensor, wherein the optical proximity sensor is disposed in an electronic device including a cover disposed between the optical proximity sensor and a detected object, the digital calibration method comprising the following steps:
   emitting, in a test mode, a test light to the cover by a light transmitter of a light sensor circuit, and reflecting the test light to form a first reflected analog signal to a light receiver of the light sensor circuit by the cover;
   converting the first reflected analog signal into a first reflected digital signal by an analog-digital converter circuit in the test mode;
   counting a first number of pulse waves of the first reflected digital signal by a digital calibration circuit in the test mode;
   emitting a light to the cover by the light transmitter, then reflecting the light to the detected object through the cover, and then reflecting the light to form a second reflected analog signal to the light receiver by the detected object, in a calibration mode;
   converting the second reflected analog signal into a second reflected digital signal by the analog-digital converter circuit in the calibration mode;

start counting the number of pulse waves of the second reflected digital signal by the digital calibration circuit in the calibration mode; and clearing, in the calibration mode, the first number and then recounting the number of pulse waves of the second reflected digital signal to obtain a second number, when counting the number of pulse waves of the second reflected digital signal up to the first number by the digital calibration circuit.

8. The digital calibration method of claim 7, further comprising steps of:

charging a capacitor to have a first capacitor voltage by a current of the first reflected analog signal;

comparing the first capacitor voltage with a reference voltage of a reference voltage source to output the first reflected digital signal by a comparator of the analog-digital converter circuit;

charging the capacitor to have a second capacitor voltage by a current of the second reflected analog signal; and comparing the second capacitor voltage with the reference voltage to output the second reflected digital signal by the comparator.

9. The digital calibration method of claim 8, further comprising steps of:

turning on a switch component by the first reflected digital signal to reduce a voltage of an input terminal of the comparator to zero from the first capacitor voltage; and turning on the switch component by the second reflected digital signal to reduce a voltage of the input terminal of the comparator to zero from the second capacitor voltage.

10. The digital calibration method of claim 7, further comprising steps of:

converting a leakage current analog signal of the optical proximity sensor into a leakage current digital signal by the analog-digital converter circuit in a leakage current detection mode;

counting a third number of the leakage current digital signal by the digital calibration circuit in the leakage current detection mode; and clearing, in the calibration mode, the first number and the third number and then recounting the number of pulse waves of the second reflected digital signal to obtain the second number, when counting the number of pulse waves of the second reflected digital signal up to the first number and the third number by the digital calibration circuit.

11. The digital calibration method of claim 10, further comprising steps of:

flowing a current of the leakage current analog signal to the capacitor to charge the capacitor to have a leakage current capacitor voltage; and comparing the leakage current capacitor voltage with a reference voltage of a reference voltage source to output the leakage current digital signal by a comparator of the analog-digital converter circuit.

12. The digital calibration method of claim 11, further comprising a step of:

turning on a switch component by the leakage current digital signal to reduce a voltage of an input terminal of the comparator to zero from the leakage current capacitor voltage.

* * * * *